(12) United States Patent
Xiao

(10) Patent No.: US 8,815,680 B2
(45) Date of Patent: Aug. 26, 2014

(54) NON-VOLATILE MEMORY HAVING NANO CRYSTALLINE SILICON HILLOCKS FLOATING GATE

(75) Inventor: Deyuan Xiao, Shanghai (CN)

(73) Assignees: Semiconductor Manufacturing International (Shanghai) Corp., Shanghai (CN); Semiconductor Manufacturing International (Beijing) Corp., Beijing (CN)

( * ) Notice: Subject to any disclaimer, the term of this patent is extended or adjusted under 35 U.S.C. 154(b) by 219 days.

(21) Appl. No.: 12/886,534

(22) Filed: Sep. 20, 2010

(65) Prior Publication Data

US 2011/0084328 A1  Apr. 14, 2011

(30) Foreign Application Priority Data

Oct. 13, 2009  (CN) .......................... 2009 1 0197085

(51) Int. Cl.
*H01L 21/336* (2006.01)

(52) U.S. Cl.
USPC .................................. 438/257; 257/E21.422

(58) Field of Classification Search
None
See application file for complete search history.

(56) References Cited

U.S. PATENT DOCUMENTS

| | | | | |
|---|---|---|---|---|
| 4,412,900 | A * | 11/1983 | Tanaka et al. | 204/192.26 |
| 5,999,444 | A * | 12/1999 | Fujiwara et al. | 365/185.02 |
| 6,027,569 | A * | 2/2000 | Brown | 118/725 |
| 6,259,133 | B1 * | 7/2001 | Gardner et al. | 257/315 |
| 2003/0232506 | A1 * | 12/2003 | Metzner et al. | 438/761 |
| 2004/0026682 | A1 * | 2/2004 | Jiang | 257/4 |
| 2005/0093054 | A1 * | 5/2005 | Jung | 257/310 |
| 2005/0184334 | A1 * | 8/2005 | Kim et al. | 257/324 |
| 2006/0043463 | A1 * | 3/2006 | Liu et al. | 257/316 |
| 2006/0125006 | A1 * | 6/2006 | Harada et al. | 257/345 |
| 2007/0007123 | A1 * | 1/2007 | Takahashi et al. | 204/192.1 |
| 2007/0145344 | A1 * | 6/2007 | Jeng | 257/2 |
| 2007/0298536 | A1 * | 12/2007 | Ren et al. | 438/102 |
| 2010/0258851 | A1 * | 10/2010 | Liu et al. | 257/316 |
| 2011/0044115 | A1 * | 2/2011 | Quek et al. | 365/185.29 |

* cited by examiner

*Primary Examiner* — Michael Lebentritt
*Assistant Examiner* — Kevin Quinto
(74) *Attorney, Agent, or Firm* — Kilpatrick Townsend & Stockton LLP

(57) ABSTRACT

A method for making a non-volatile memory device provides a semiconductor substrate including a surface region and a tunnel dielectric layer overlying the surface region. Preferably the tunnel dielectric layer is a high-K dielectric, characterized by a dielectric constant higher than 3.9. The method forms a source region within a first portion and a drain region within a second portion of the semiconductor substrate. The method includes forming a first and second nanocrystalline silicon structures overlying the first and second portions between the source region and the drain region to form a first and second floating gate structures while maintaining a separation between the first and second nanocrystalline silicon structures. The method includes forming a second dielectric layer overlying the first and second floating gate structures. The method also includes forming a control gate structure overlying the first and second floating gate structures.

11 Claims, 12 Drawing Sheets

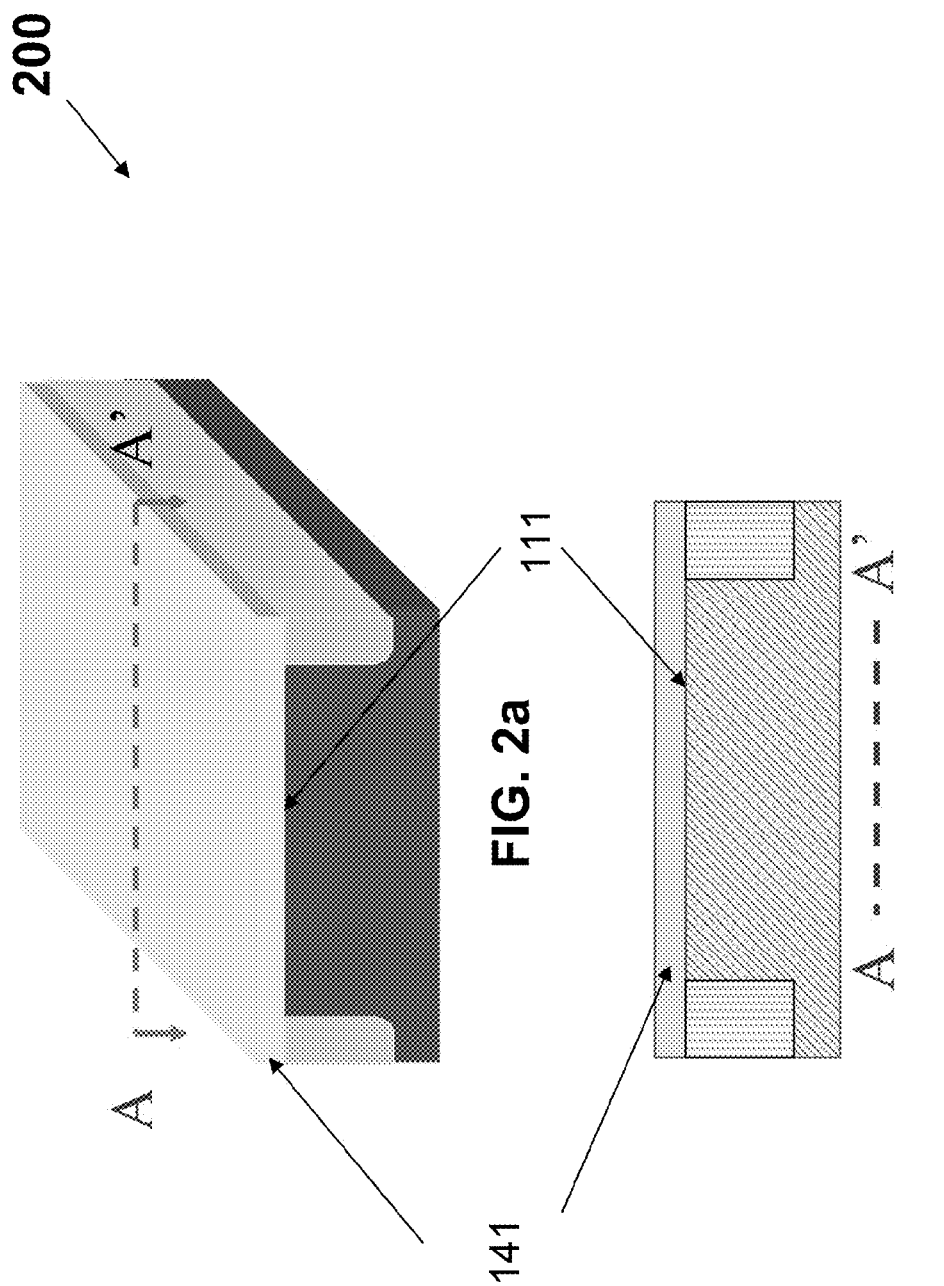

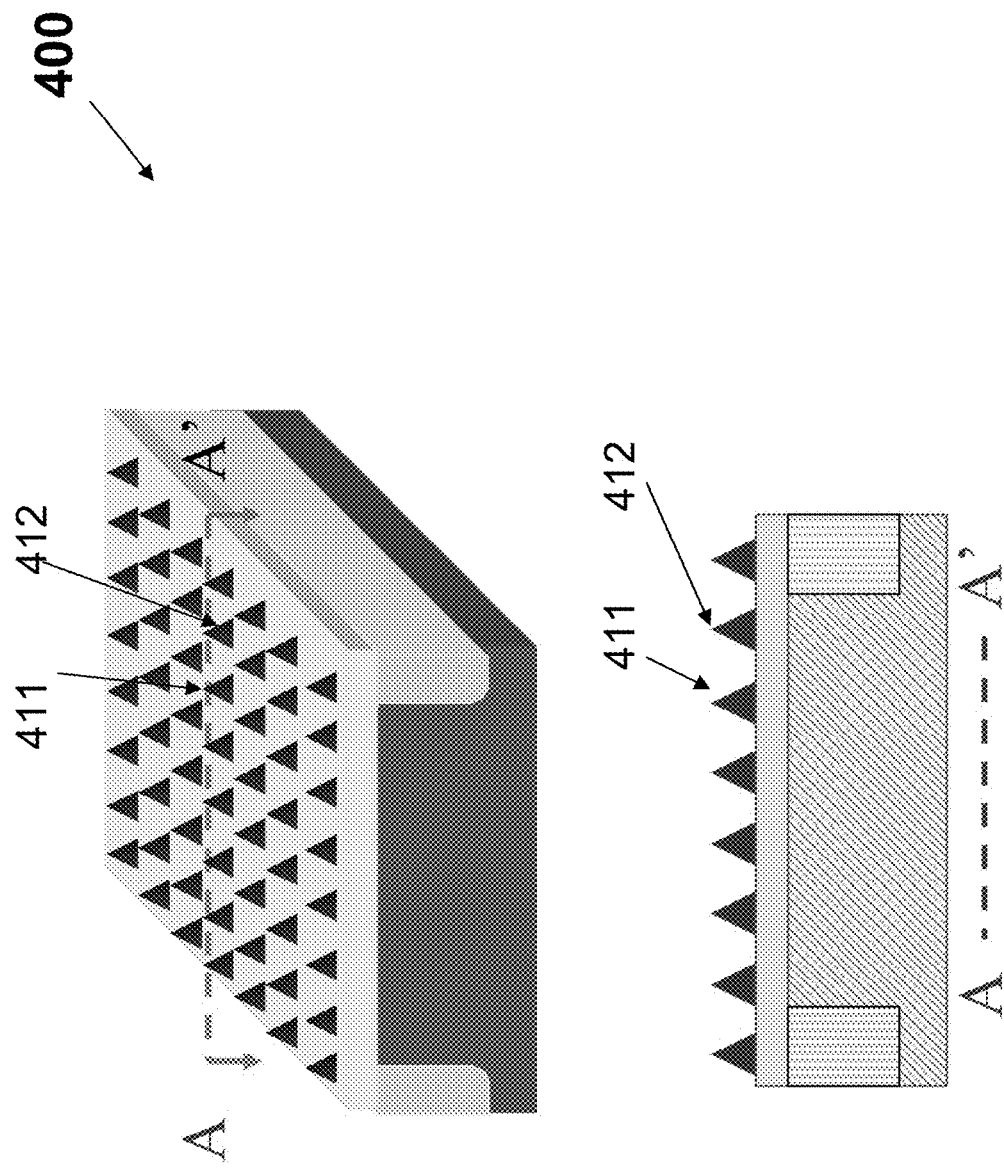

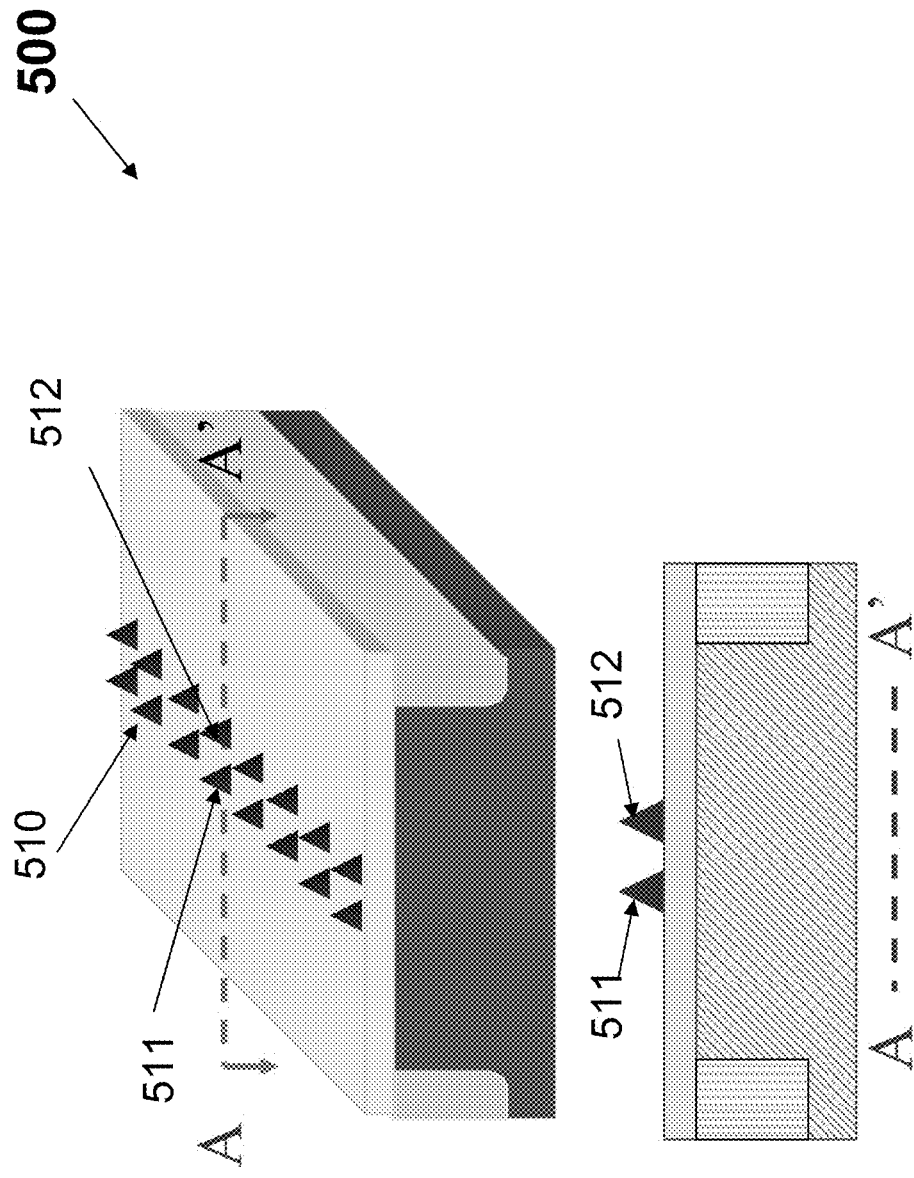

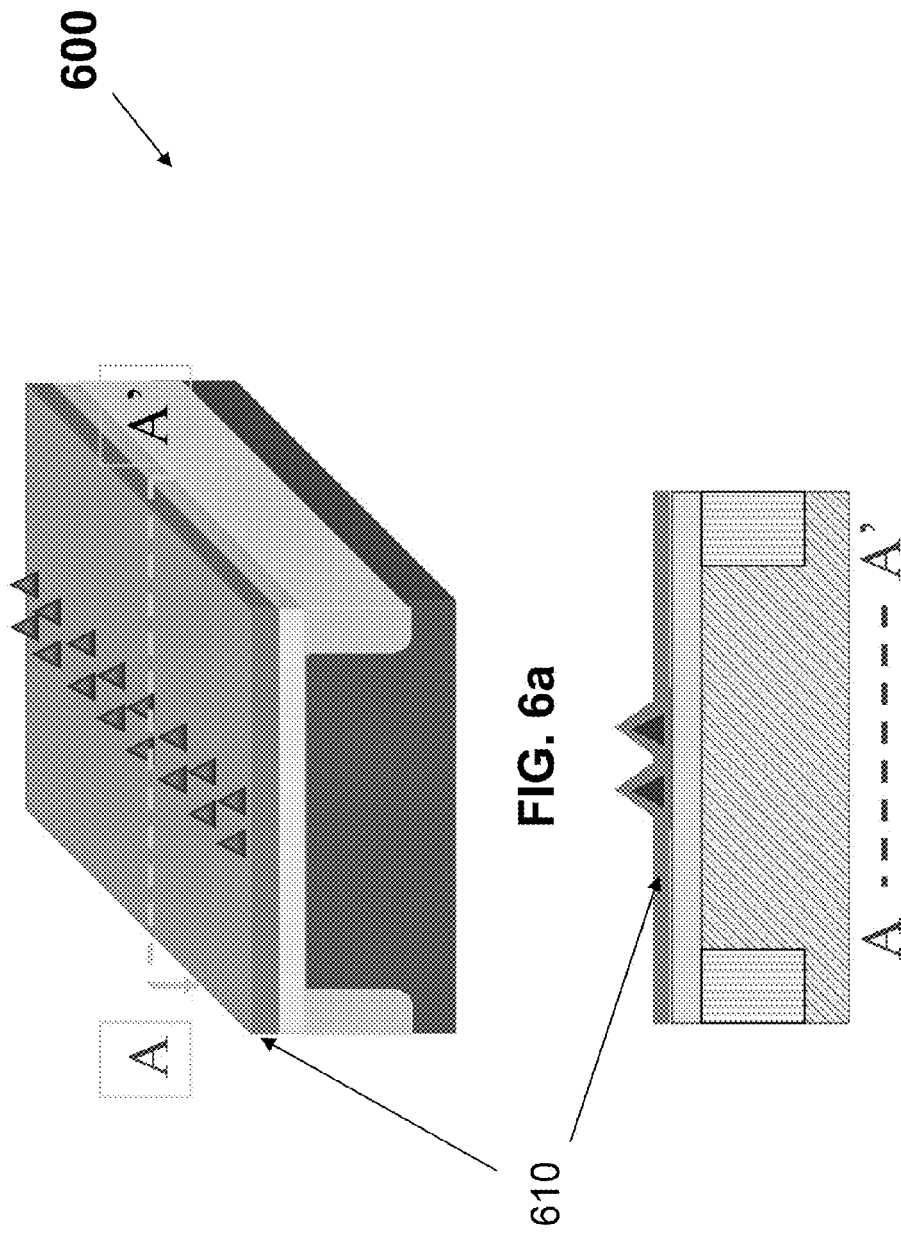

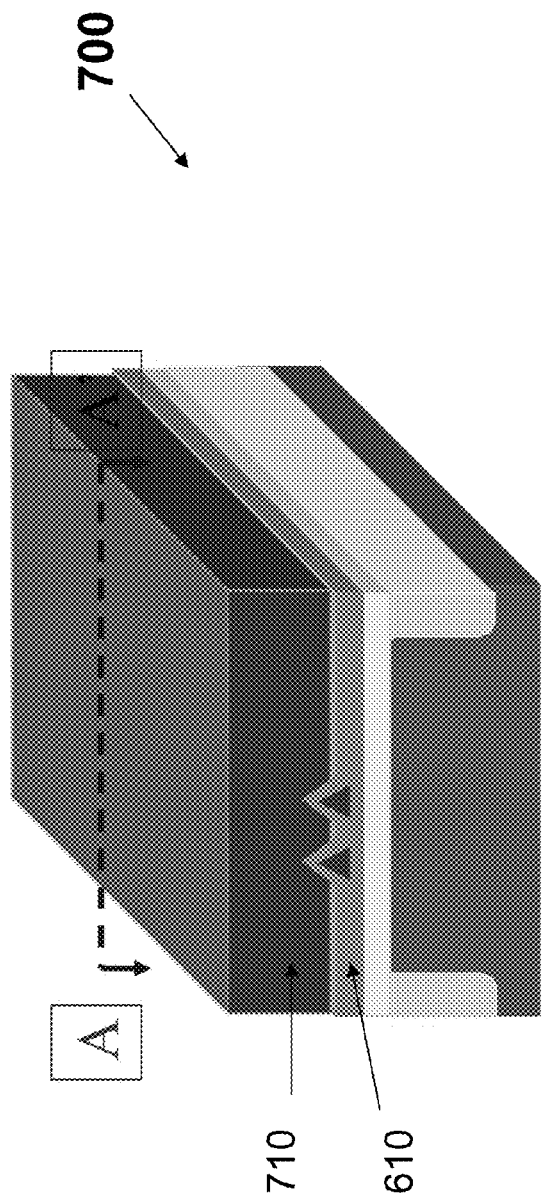
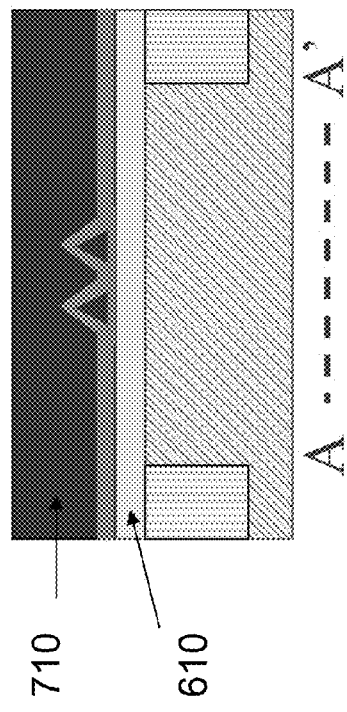
FIG. 7a
FIG. 7b

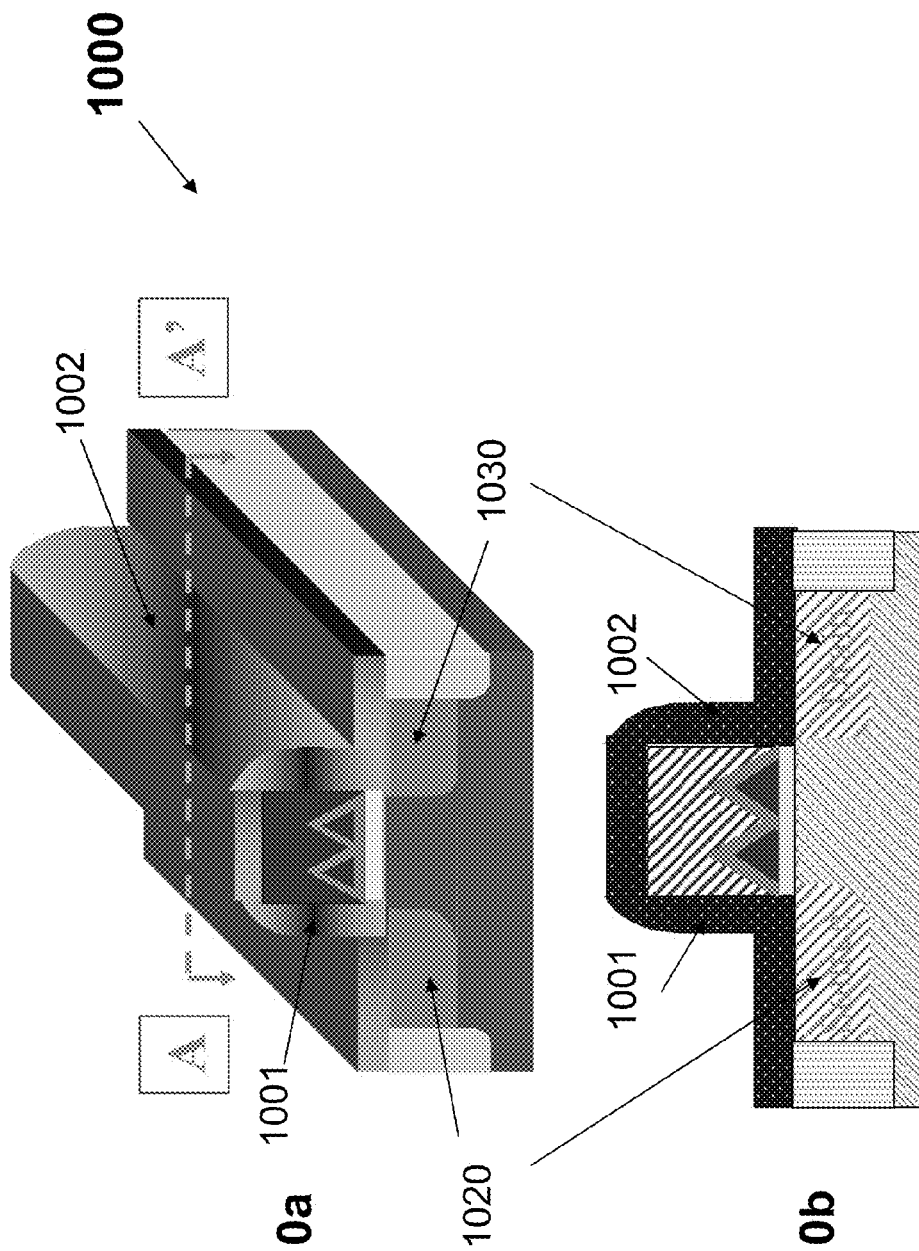

NON-VOLATILE MEMORY HAVING NANO CRYSTALLINE SILICON HILLOCKS FLOATING GATE

CROSS-REFERENCES TO RELATED APPLICATIONS

This application claims priority to Chinese Patent Application No. 200910197085.6, filed Oct. 13, 2009, commonly assigned, incorporated in its entirety by reference herein for all purposes.

BACKGROUND OF THE INVENTION

The present invention is directed to integrated circuits and their processing for the manufacture of semiconductor devices. More particularly, the invention provides a method and device for a non-volatile memory (NVM) device having nanocrystalline silicon hillock floating gates and high K tunneling dielectric. Merely by way of example, the invention has been applied to provide high programming efficiency and data retention characteristic for a non-volatile memory device. But it would be recognized that the invention has a much broader range of applicability. For example, the invention can be applied to integrated circuits incorporating embedded non-volatile memories or memory card applications.

As semiconductor device feature size continues to scale down to nanometer regime, conventional floating gate non-volatile memory (NVM) devices have difficulty in maintaining device performance. To fabricate devices beyond current scaling limits, integrated circuit manufacturers are rigorously exploring alternative materials and device structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is non-volatile memory devices for the manufacture of integrated circuits in a cost effective and efficient way.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China, is an example of a chip company that performs foundry services. Although fabless chip companies and foundry services have increased through the years, many limitations still exist. For example, as logic devices are scaled and designed to operate under lower voltages, non-volatile memory devices are difficult to scale down and continue to need high voltages to operate.

Non-volatile MOSFET memory devices based on nanocrystalline (NC) silicon floating gates have been reported as an alternative to conventional floating gate NVM devices. Nanocrystalline floating gates can provide good device performance, such as low power consumption, high writing endurance, good programming and erase performance and small device size. Such device has become a candidate for next generation NVM memory.

However certain limitations still exist with nano-crystalline floating gate devices. Because nano-crystalline floating gates are less sensitive to defects in the tunnel oxide, thinner tunnel oxides can be used in a non-volatile memory device. Low voltage and high programming efficiency can therefore be achieved. However, a thin tunnel oxide is prone to charge leakage and degraded data retention. Therefore convention non-volatile memory devices with $SiO_2$ tunneling barrier are limited by the trade-off between programming efficiency and data retention. In addition, it is difficult to grow nano-crystalline (NC) silicon material and to control the size and shape of the NC dots (particles). This leads to difficulties in control of the program and erase characteristics of the device.

From the above, it is seen that an improved technique for processing semiconductor devices is desired.

BRIEF SUMMARY OF THE INVENTION

According to the present invention, techniques directed to integrated circuits and their processing are provided for the manufacture of semiconductor devices. More particularly, the invention provides a method and device for a non-volatile memory (NVM) device having nanocrystalline silicon hillock floating gates and high K tunneling dielectric. Merely by way of example, the invention has been applied to provide high programming efficiency and data retention characteristic for a non-volatile memory device. But it would be recognized that the invention has a much broader range of applicability. For example, the invention can be applied to integrated circuits incorporating embedded non-volatile memories or memory card applications.

According to an embodiment of the invention, a method is provided for making a non-volatile memory device. The method includes providing a semiconductor substrate including a surface region and forming a tunnel dielectric layer overlying the surface region. The method forms a source region within a first portion of the semiconductor substrate and forms a drain region within a second portion of the semiconductor substrate. The method includes forming a first nanocrystalline silicon structure overlying a first portion between the source region and the drain region to form a first floating gate structure. The method forms a second nanocrystalline silicon structure overlying a second portion between the source region and the drain region to form a second floating gate structure, while maintaining separation from the first nanocrystalline silicon structure. The method also includes forming a second dielectric layer overlying the first floating gate structure and the second floating gate structure. The method includes forming a control gate structure overlying the first floating gate structure and the second floating gate structure.

In a specific embodiment, the forming of the first and the second nanocrystalline silicon structures includes using a high density plasma species. In an embodiment, the forming of the first nanocrystalline silicon structure and the forming of the second nanocrystalline silicon structure further include heating the semiconductor substrate to above 500° C. in an argon ambient with an argon flow of about 50-500 sccm, depositing the silicon nanocrystalline structure under a pressure of less than 1.0 torr, argon flow of about 50-500 sccm, and SiH$_4$ flow of about 10-200 sccm, and sputtering the deposited silicon nanocrystalline structure in an argon ambient, with an argon flow of about 50-500 sccm and an RF bias power of about 500-3000 Watts. In a specific embodiment, the method includes repeating the heating, depositing, and sputtering steps at least one time. In a specific embodiment, forming a tunnel dielectric layer includes depositing HfO$_2$ layer to a thickness of about 1-20 nm by LPCVD using Hafnium t-butoxide (Hf(OC$_4$H$_9$)$_4$) precursor at about 300-500° C. with a pressure of about 1.0 torr and annealing the HfO$_2$ layer at about 600-800° C. in a gas ambient comprising NH$_3$ or N$_2$. In an embodiment, the second dielectric layer is selected from the group consisting of HfO$_2$, Al$_2$O$_3$, SiON, and SiN. In another embodiment, the second dielectric layer is characterized by a dielectric constant higher than 3.9.

In an embodiment, the first floating gate structure is less than about 20 nanometers. In a specific embodiment, the second floating gate structure is less than about 20 nanometers. In some embodiments, the first floating gate structure is characterized by a triangular shape. In some embodiments, the second floating gate structure is characterized by a triangular shape.

An alternative embodiment of the invention provides a non-volatile memory device. The device includes a semiconductor substrate including a surface region and a tunnel dielectric layer overlying the surface region. The device includes a source region within a first portion of the semiconductor substrate and a drain region within a second portion of the semiconductor substrate. The device also includes a first nanocrystalline silicon structure overlying a first portion between the source region and the drain region to form a first floating gate structure. The device includes a second nanocrystalline silicon structure overlying a second portion between the source region and the drain region to form a second floating gate structure. The second nanocrystalline silicon structure is separated from the first nanocrystalline silicon structure. The device includes a second dielectric layer overlying the first floating gate structure and the second floating gate structure. The device further includes a control gate structure overlying the first floating gate structure and the second floating gate structure.

In a specific embodiment of the present invention, the first nanocrystalline silicon structure and the second nanocrystalline silicon structure are formed by using a high density plasma species. In an embodiment, the first nanocrystallne silicon structure and the second nanocrystalline silicon structure are formed by a process that further includes heating the semiconductor substrate to above 500° C. in an argon ambient with an argon flow of about 50-500 sccm, depositing the silicon nanocrystalline structure under a pressure of less than 1.0 torr, argon flow of about 50-500 sccm, and SiH$_4$ flow of about 10-200 sccm, and sputtering the deposited silicon nanocrystalline structure in an argon ambient, with an argon flow of about 50-500 sccm and an RF bias power of about 500-3000 Watts. In a specific embodiment, the nanocrystalline structures are formed by repeating the heating, depositing, and sputtering steps at least one time. In an embodiment, the tunnel dielectric layer is selected from the group consisting of HfO$_2$, Al$_2$O$_3$, SiON, and SiN. In a specific embodiment, a tunnel dielectric layer is formed by depositing HfO$_2$ layer to a thickness of about 1-20 nm by LPCVD using Hafnium t-butoxide (Hf(OC$_4$H$_9$)$_4$) precursor at about 300-500° C. with a pressure of about 1.0 torr, and annealing the HfO$_2$ layer at about 600-800° C. in a gas ambient comprising NH$_3$ or N$_2$. In another embodiment, the second dielectric layer is characterized by a dielectric constant higher than 3.9. In an embodiment, the first floating gate structure is less than about 20 nanometers. In a specific embodiment, the second floating gate structure is less than about 20 nanometers. In some embodiments, the first floating gate structure is characterized by a triangular shape. In some embodiments, the second floating gate structure is characterized by a triangular shape.

In yet an alternative embodiment, the invention provides a non-volatile memory cell. The non-volatile memory cell includes a semiconductor substrate and a tunnel dielectric layer overlying the substrate. The non-volatile memory cell includes a nanocrystalline silicon floating gate structure on the tunnel dielectric layer. The nanocrystalline silicon floating gate structure is capable of holding one to ten electrons. The non-volatile memory cell also includes a control gate overlying the nanocrystalline silicon floating gate. In a specific embodiment, the tunnel dielectric layer is characterized by a dielectric constant higher than 3.9. In certain embodiments, the nanocrystalline silicon floating gate structure is characterized by a triangular shape.

Numerous benefits are achieved using one or more features of the present invention. In a specific embodiment, the present invention includes a high K tunneling dielectric having a lower electron barrier height and a larger physical thickness as compared with conventional SiO$_2$. In some embodiments, nano-crystalline silicon hillocks allow thinner dielectric and lower erase voltages. In some embodiments, the lower voltage requirements make it easier to implement on-chip charge pump circuits. Depending upon the specific embodiment, the invention also provides a method that is implemented using conventional process technology and equipment. Depending upon the embodiment, one or more of these benefits may be achieved. These and other benefits are described throughout the present specification and more particularly below.

BRIEF DESCRIPTION OF THE DRAWINGS

FIGS. 2a and 2b are simplified view diagrams of a method for making a non-volatile memory device according to an embodiment of the invention;

FIGS. 4a and 4b are simplified view diagrams of a method for making a non-volatile memory device according to an embodiment of the invention;

FIGS. 5a and 5b are simplified view diagrams of a method for making a non-volatile memory device according to an embodiment of the invention;

FIGS. 6a and 6b are simplified view diagrams of a method for making a non-volatile memory device according to an embodiment of the invention;

FIGS. 7a and 7b are simplified view diagrams of a method for making a non-volatile memory device according to an embodiment of the invention;

FIGS. 10a and 10b are simplified view diagrams of a method for making a non-volatile memory device according to an embodiment of the invention;

DETAILED DESCRIPTION OF THE INVENTION

According to the present invention, techniques directed to integrated circuits and their processing are provided for the manufacture of semiconductor devices. More particularly, the invention provides a method and device for a non-volatile memory (NVM) device having nanocrystalline silicon hillock floating gates and high K tunneling dielectric. Merely by way of example, the invention has been applied to provide high programming efficiency and data retention characteristics for a non-volatile memory device. But it would be recognized that the invention has a much broader range of applicability. For example, the invention can be applied to integrated circuits incorporating embedded non-volatile memories or memory card applications.

Depending upon the embodiment, the present invention includes various features, which may be used. These features include the following:

1. High K tunneling gate dielectric providing a lower electron barrier height and a larger physical thickness as compared with conventional $SiO_2$;
2. Nano-crystalline silicon hillocks allowing thinner dielectric layers and lower erase voltages; and
3. Improved device performance in programming efficiency and data retention characteristics.

As shown, the above features may be in one or more of the embodiments to follow. These features are merely examples, which should not unduly limit the scope of the claims herein. One of ordinary skill in the art would recognize many variations, modifications, and alternatives.

A method for fabricating a non-volatile memory device according to an embodiment of the present invention may be outlined as follows:

1. Provide a semiconductor substrate including a surface region;
2. Form a high K tunnel dielectric layer;
3. Form a source region;
4. Form a drain region;
5. Form nanocrystalline silicon floating gate structures;
6. Form a second dielectric layer overlying the floating gate structures; and
7. Form a control gate structure.

The above sequence of steps provides a method for fabricating an integrated circuit including a non-volatile memory device according to an embodiment of the present invention. As shown, the method uses a combination of steps including a way of fabricating nano-crystalline silicon hillock floating gates on a high K tunneling dielectric. Other alternatives can also be provided where steps are added, one or more steps are removed, or one or more steps are provided in a different sequence without departing from the scope of the claims herein. Further details of the present method can be found throughout the present specification and more particularly below.

Figures 1A, 1B:
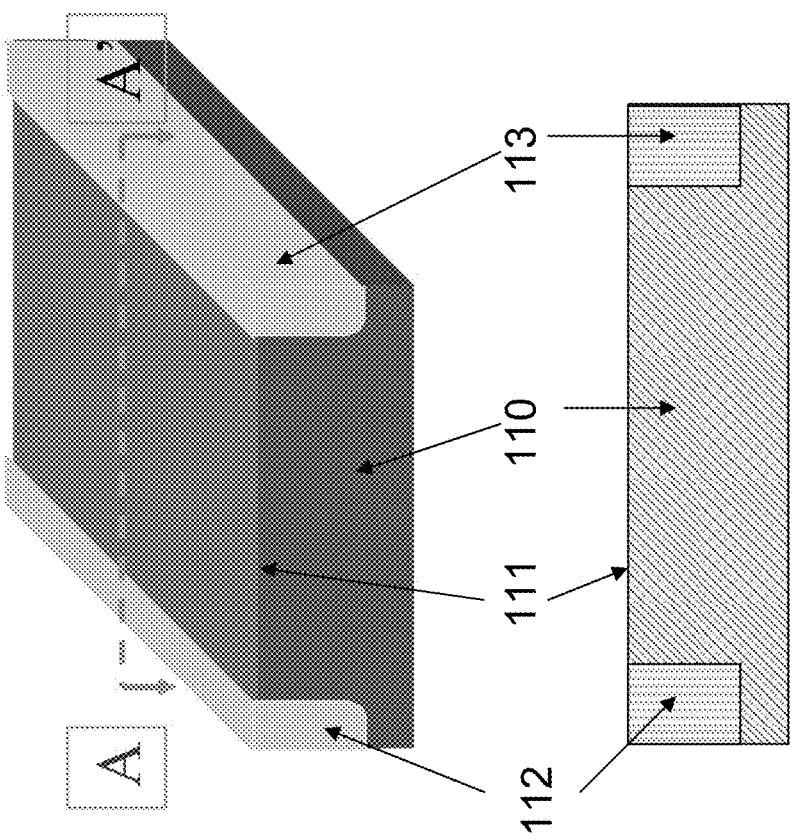
FIGS. 1a and 1b are simplified view diagrams of a method for making a non-volatile memory device according to an embodiment of the invention.

FIGS. 1a and 1b are simplified 3-D and cross-sectional view diagrams, respectively, of a method for making a non-volatile memory device according to an embodiment of the invention. These diagrams are merely examples, which should not unduly limit the scope of the claims herein. One of ordinary skill in the art would recognize other variations, modifications, and alternatives. As shown, the method according to an embodiment of the invention starts by providing a silicon substrate 110 including a surface region 111 and then forms isolation regions 112 and 113 in the substrate for separating active device areas. In a specific embodiment, the isolation regions are shallow trench isolation (STI) regions. A shallow trench isolation (STI) region can be formed by a conventional process, including active area oxide formation, active area nitride deposition, anti-reflective coating (DARC) layer deposition, and active area photolithography. In an embodiment, a silicon nitride film is deposited at a temperature range of approximately 700-800° C. to a thickness of about 100-500 nm. Of course, there can be other variations, modifications, and alternatives. Photoresist layers are usually used to define active areas between isolation regions. In an embodiment, deep UV (DUV) lithography is used for exposure. The nitride layer, oxide layer, and silicon trench regions are then etched to define isolation regions. A liner oxide is grown on the surfaces of the shallow trenches. High density plasma (HDP) deposited oxide is used to fill the shallow trenches. Chemical mechanical polishing (CMP) is then performed to planarize the deposited oxide. At this point, the nitride cap layer is removed. A sacrificial oxide layer is deposited, and threshold adjustment implant (Vt implant) is carried out. In an embodiment, channel doping can be about $1 \times 10^{16}$-$5 \times 10^{17}/cm^3$. In a specific embodiment, threshold adjustment implant is performed using boron containing impurities at a dose of about $1$-$5 \times 10^{12}/cm^2$ and an implantation energy of 10-30 KeV. These implant conditions are merely an examples, which should not unduly limit the scope of the claims herein. One of ordinary skill in the art would recognize other variations, modifications, and alternatives.

FIGS. 2a and 2b are simplified 3-D and cross-sectional view diagrams, respectively, of a method for making a non-volatile memory device according to an embodiment of the invention. These diagrams are merely examples, which should not unduly limit the scope of the claims herein. One of ordinary skill in the art would recognize other variations, modifications, and alternatives. As shown, the sacrificial oxide layer is removed and a tunnel dielectric layer 141 is formed overlying the surface region 111 of the silicon substrate. In an embodiment, the tunnel dielectric layer includes a high K dielectric layer. In some embodiments, the tunnel dielectric layer has a dielectric constant higher than 3.9. In a specific embodiment, the tunnel dielectric layer is selected from the group consisting of $HfO_2$, $Al_2O_3$, SiON, and SiN. One of ordinary skill in the art would recognize other variations, modifications, and alternatives.

In an embodiment, forming the tunnel dielectric includes forming an $HfO_2$ layer according to the following steps:

1. Depositing a $HfO_2$ layer to a thickness of about 1-20 nm by LPCVD using Hafnium t-butoxide ($Hf(OC_4H_9)_4$) precursor at about 300-500° C. with a pressure of about 1.0 torr; and
2. Annealing the $HfO_2$ layer at about 600-800° C. in a gas ambient comprising $NH_3$ or $N_2$.

Of course, one of ordinary skill in the art would recognize other variations, modifications, and alternatives.

Figure 3A:
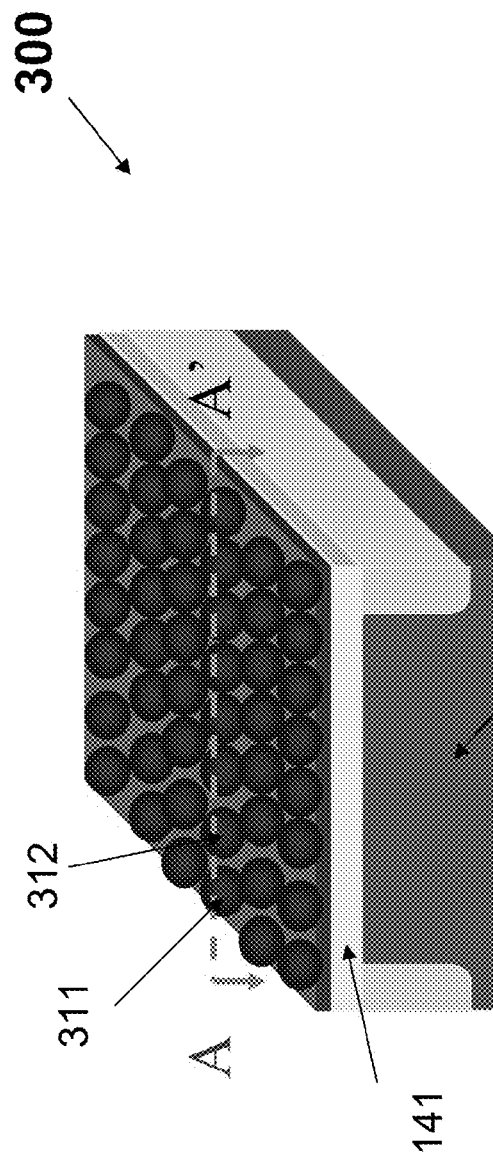
FIGS. 3a and 3b are simplified view diagrams of a method for making a non-volatile memory device according to an embodiment of the invention.
Figure 3B:
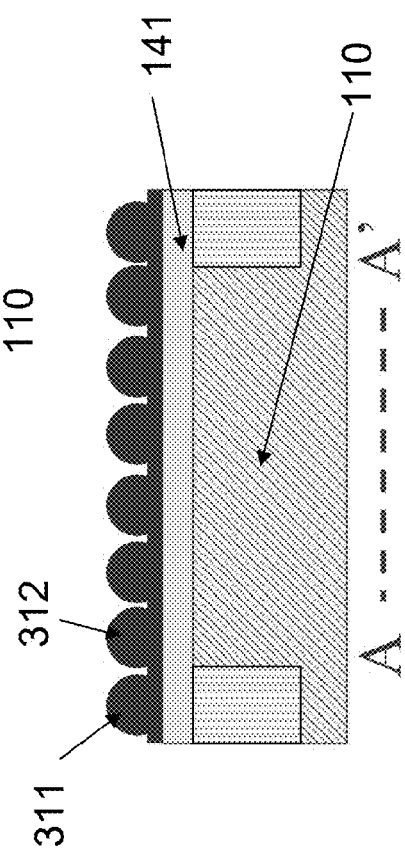

FIGS. 3a and 3b are simplified 3-D and cross-sectional view diagrams, respectively, of a method for making a non-volatile memory device according to an embodiment of the invention. These diagrams are merely examples, which should not unduly limit the scope of the claims herein. One of ordinary skill in the art would recognize other variations, modifications, and alternatives. As shown, the method includes forming a plurality of silicon nanocrystalline structures, including forming of a first nanocrystalline silicon structure, e.g., 311 and forming a second nanocrystalline silicon structure, e.g., 312. In a specific embodiment, the nanocrystalline silicon structures are formed according to the following process.

1. Placing a semiconductor substrate in a process chamber;
2. Heating the semiconductor substrate to above 500° C. in an argon ambient with an argon flow of about 50-500 sccm. The RF process power for heating is about 500-5000 Watts; and
3. Depositing silicon nanocrystalline structures under a high density plasma generated by an RF process power of about 500-5000 Watts in a pressure of less than 1.0 torr, argon flow of about 50-500 sccm, and $SiH_4$ flow of about 10-200 sccm.

As shown in FIGS. 3a and 3b, silicon nanocrystalline (Si—NC) structures 311 and 312 are formed on the tunnel dielectric layer 141 overlying the substrate 110. In an embodiment, the dimension of Si—NC structures can range from 1 nm to 10 nm in diameter and can have a density of about $1 \times 10^{10}/cm^2 \sim 1 \times 10^{12}/cm^2$. Of course, there can be other variations, modifications, and alternatives.

In a specific embodiment, the silicon nanocrystalline structures are subject to sputtering to form hillock-like structures, as shown in FIGS. 4a and 4b. These diagrams are merely examples, which should not unduly limit the scope of the claims herein. One of ordinary skill in the art would recognize other variations, modifications, and alternatives. In a specific embodiment, the sputtering is carried out in an argon ambient, with an argon flow of about 50-500 sccm, an RF process power of about 500-5000 Watts, and an RF bias power of about 500-3000 Watts. As described below, the silicon nanocrystalline hillock structures (Si—NCs) 411 and 412 are used as floating gates in a non-volatile memory device. Depending on the embodiment, the hillocks can have different shapes. For example, silicon nanocrystalline hillock structures (Si—NCs) 411 and 412 can be triangular in shape. In some embodiments, a hillock structure has a wide base coupled to the tunnel dielectric layer and a top pointing away from the tunnel dielectric layer. In some embodiments, the hillocks can be tetrahedral in shape. In some embodiments, the hillocks can have pointed top portions and broader base portions. Of course, there can be other variations, modifications, and alternatives.

In a specific embodiment, the method of forming silicon nanocrystalline hillock structures (Si—NCs) described above can be repeated to form hillocks of larger sizes. In an embodiment, the process of heating the substrate, depositing the nanocrystalline structures, and sputtering to form hillocks can be repeated one to five times. In an embodiment, nanocrystalline hillock structures, such as 411 and 412, are separated from each other. In a specific embodiment, a nanocrystalline silicon hillock structure is capable of holding one to ten electrons. Depending on the embodiments, a nanocrystalline silicon hillock structure may be capable of holding more electrons. Of course, there can be other variations, modifications, and alternatives.

FIGS. 5a and 5b are simplified 3-D and cross-sectional view diagrams, respectively, of a method for making a non-volatile memory device according to an embodiment of the invention. These diagrams are merely examples, which should not unduly limit the scope of the claims herein. One of ordinary skill in the art would recognize other variations, modifications, and alternatives. As shown, the silicon nanocrystalline hillock structures (Si—NCs) are patterned to form floating gates. In a specific embodiment, an antireflective coating (DARC) layer, such as SiON, is deposited. Then a photoresist layer is deposited and patterned. The polysilicon gate layer is then etched using a conventional RIE technique. Afterwards, the photoresist layer and DARC layer are stripped. As shown in FIGS. 5a and 5b, floating gate 510 includes silicon nanocrystalline hillock structures (Si—NCs) such as 511 and 512. Of course, there can be other variations, modifications, and alternatives.

FIGS. 6a and 6b are simplified 3-D and cross-sectional view diagrams, respectively, of a method for making a non-volatile memory device according to an embodiment of the invention. These diagrams are merely examples, which should not unduly limit the scope of the claims herein. One of ordinary skill in the art would recognize other variations, modifications, and alternatives. As shown, the method includes forming a dielectric layer 610 over the floating gates. In an embodiment, dielectric layer 610 includes a high K dielectric layer. In some embodiments, the dielectric layer has a dielectric constant higher than 3.9. In a specific embodiment, the dielectric layer is selected from the group consisting of $HfO_2$, $Al_2O_3$, SiON, and SiN. Of course one of ordinary skill in the art would recognize other variations, modifications, and alternatives.

In a specific embodiment, forming the dielectric layer 610 includes forming an $HfO_2$ layer according to the following steps:

1. Depositing an $HfO_2$ layer to a thickness of about 1-20 nm by LPCVD using Hafnium t-butoxide ($Hf(OC_4H_9)_4$) precursor at about 300-500° C. with a pressure of about 1.0 torr; and
2. Annealing the $HfO_2$ layer at about 600-800° C. in a gas ambient comprising $NH_3$ or $N_2$.

Of course, one of ordinary skill in the art would recognize other variations, modifications, and alternatives.

FIGS. 7a and 7b are simplified 3-D and cross-sectional view diagrams, respectively, of a method for making a non-volatile memory device according to an embodiment of the invention. These diagrams are merely examples, which should not unduly limit the scope of the claims herein. One of ordinary skill in the art would recognize other variations, modifications, and alternatives. As shown, the method deposits a control gate polysilicon layer 710 over dielectric layer 610, as shown in FIG. 7a. In an embodiment, a polysilicon film 710 is deposited in a temperature range of approximately 600° C. to 800° C. and a thickness in a range of about 100-500 nm. In a specific embodiment, the polysilicon film is doped in-situ with N-type impurities such as phosphorus. After the control gate polysilicon layer deposition, a CMP process is performed to planarize the polysilicon layer. An antireflective coating (DARC) is then deposited over the polysilicon layer in preparation for a photolithography step.

Figure 8A:
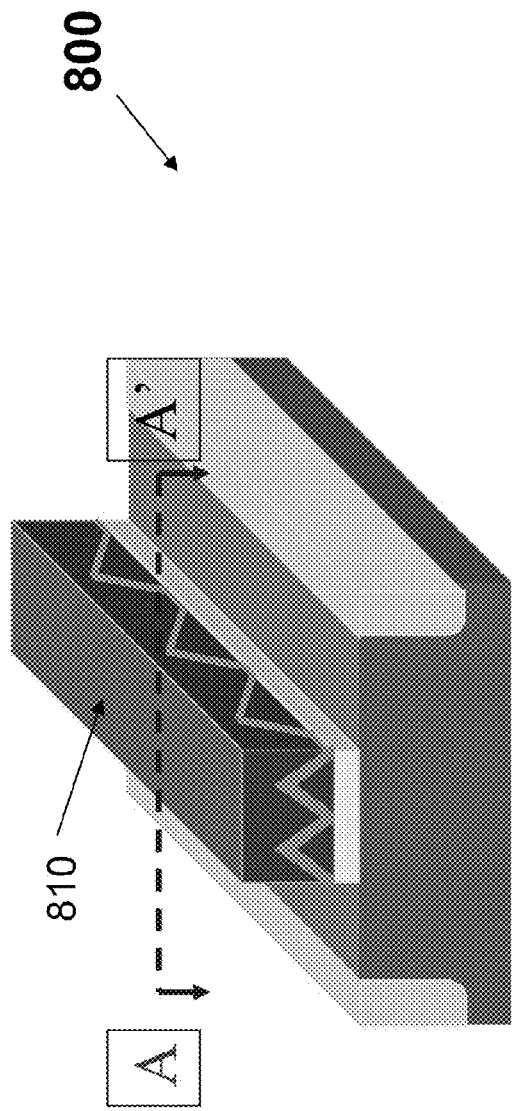
FIGS. 8a and 8b are simplified view diagrams of a method for making a non-volatile memory device according to an embodiment of the invention.
Figure 8B:
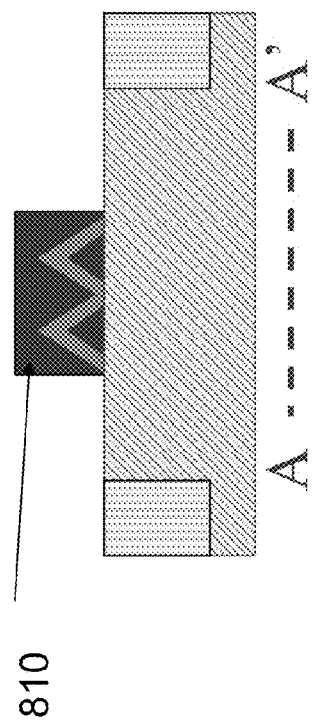

FIGS. 8a and 8b are simplified view diagrams of a method for making a non-volatile memory device according to an embodiment of the invention. FIG. 8a is a simplified 3-D view diagram, and FIG. 8b is a simplified cross sectional view diagram taken along the cross section A-A' as indicated in FIG. 8a. These diagrams are merely examples, which should not unduly limit the scope of the claims herein. One of ordinary skill in the art would recognize other variations, modifications, and alternatives. As shown, the control gate layer and floating gates are patterned and etched to form control gate 810.

Figures 9A, 9B:
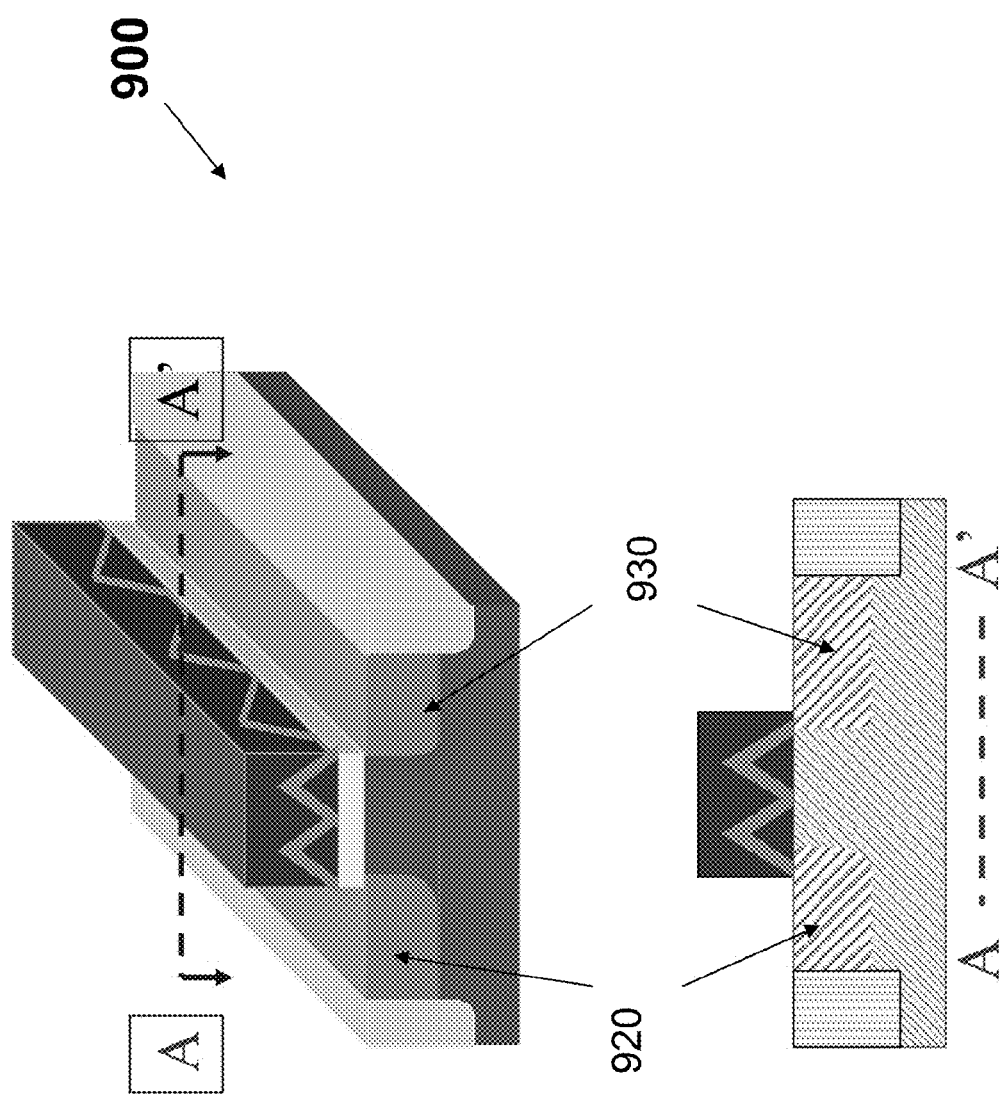
FIGS. 9a and 9b are simplified view diagrams of a method for making a non-volatile memory device according to an embodiment of the invention.

FIGS. 9a and 9b are simplified view diagrams of a method for making a non-volatile memory device according to an embodiment of the invention. FIG. 9a is a simplified 3-D view diagram, and FIG. 9b is a simplified cross sectional view diagram taken along the cross section A-A' as indicated in FIG. 9. These diagram are merely examples, which should not unduly limit the scope of the claims herein. One of ordinary skill in the art would recognize other variations, modifications, and alternatives. As shown, in an embodiment, after a lithography step, N-type impurities are implanted to form N-type lightly doped source region 920 and drain region 930. In other embodiments, P-type impurities can be used depending upon the application. Of course, there can be other variations, modifications, and alternatives.

FIGS. 10a and 10b are simplified view diagrams of a method for making a non-volatile memory device according to an embodiment of the invention. FIG. 10a is a simplified 3-D view diagram, and FIG. 10b is a simplified cross sectional view diagram taken along the cross section A-A' as indicated in FIG. 10a. These diagrams are merely examples, which should not unduly limit the scope of the claims herein. One of ordinary skill in the art would recognize other variations, modifications, and alternatives. As shown, spacer regions 1001 and 1002 are formed by a conventional process, which includes depositing an insulating layer and etch back using RIE. In an embodiment, the method forms ONO (oxide-nitride-oxide) spacers. In other embodiments, the method can form oxynitride spacers. In a specific embodiment, the method first performs gate nitridation, followed by a high temperature oxidation (HTO) offset process. The method then forms a nitride spacer. The method also includes forming HTO layer and RIE etching to form spacers. The method also includes implanting impurities to form source region 1020 and drain region 1030. For N-type devices, the source/drain implantation includes N-type impurities such as As, at a dose of about $1$-$5 \times 10^{15}/cm^2$. Of course, there can be other variations, modifications, and alternatives.

Figure 11:
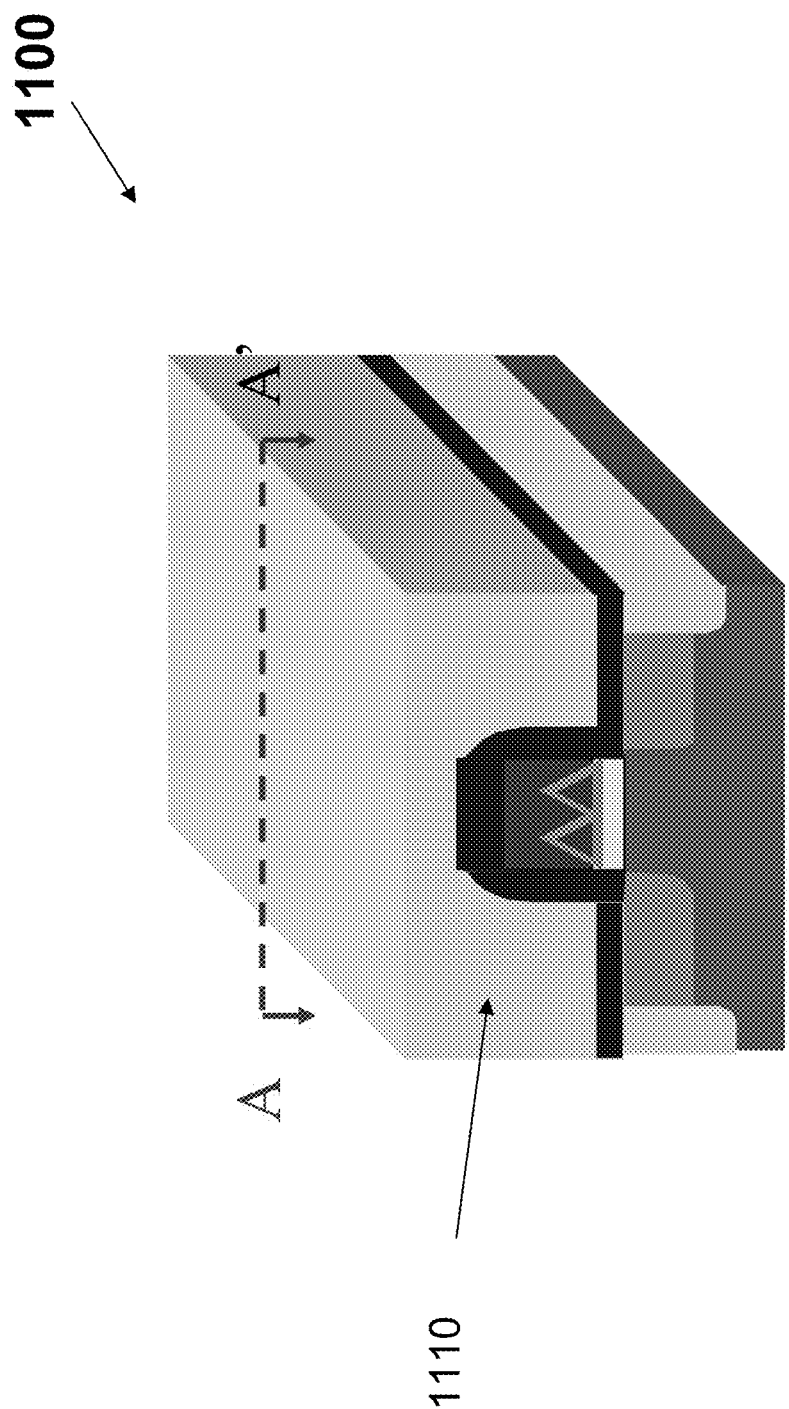
FIG. 11 is a simplified 3-D view diagram of a method for making a non-volatile memory device.

FIG. 11 is a simplified 3-D view diagram of a method 1100 for making a non-volatile memory device according to an embodiment of the invention. This diagram is merely an example, which should not unduly limit the scope of the claims herein. One of ordinary skill in the art would recognize other variations, modifications, and alternatives. As shown, an interlayer dielectric (ILD) layer 1110 is deposited by conventional HDP PSG or SACVD BPSG processes. The interlayer dielectric is then planarized using CMP. Of course, there can be other variations, modifications, and alternatives.

Figure 12:
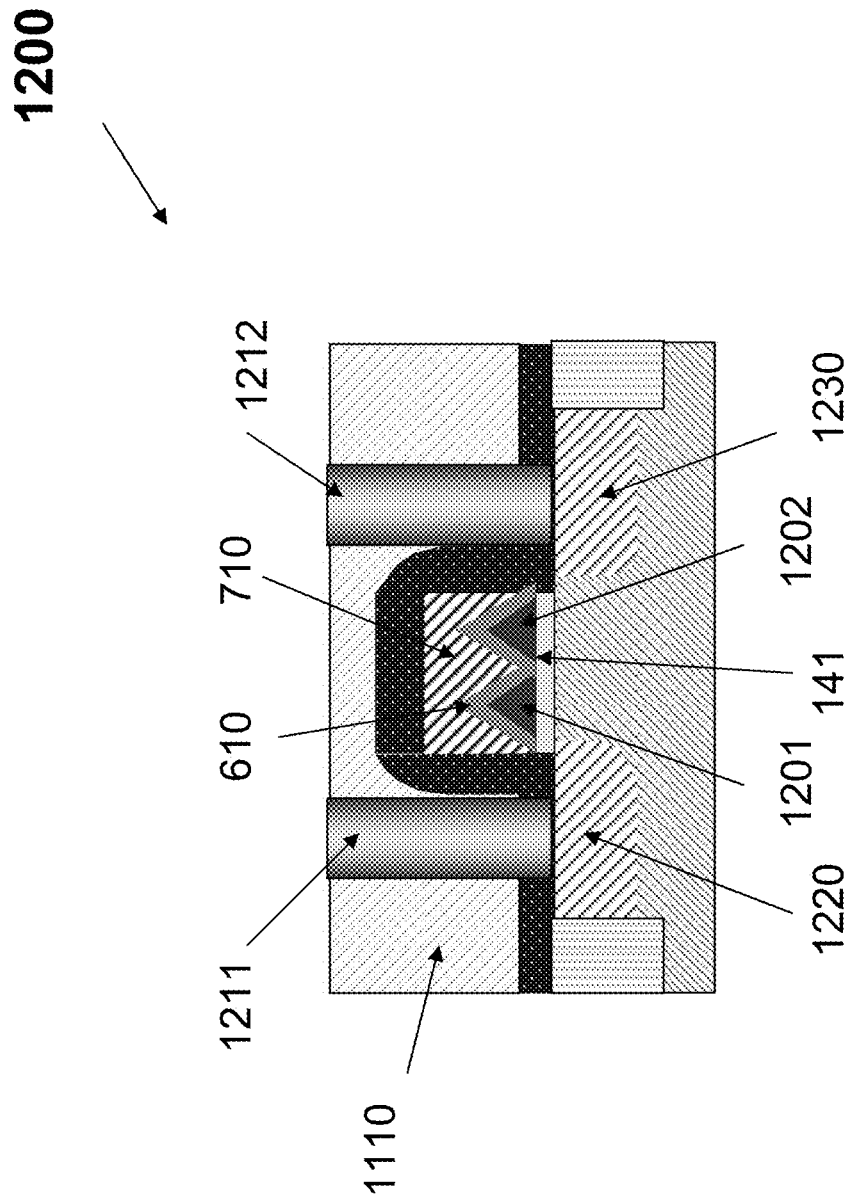
FIG. 12 is a simplified cross-sectional view diagram of a method for making a non-volatile memory device.

FIG. 12 is a simplified view diagram of a non-volatile memory device 1200 according to an embodiment of the present invention. FIG. 12 is a cross sectional view diagram taken along the cross section A-A' as indicated in FIG. 11. This diagram is merely an example, which should not unduly limit the scope of the claims herein. One of ordinary skill in the art would recognize other variations, modifications, and alternatives. As shown, contact structures 1211 and 1212 are formed in interlayer dielectric (ILD) layer 1110 as shown. In an embodiment, the contact structures are formed by conventional techniques. In some embodiments, the contact structures are tungsten plugs. Depending upon the embodiments, the contact structures can be polysilicon plugs, or other metal structures. Of course, there can be other variations, modifications, and alternatives.

The above sequence of processes provides a method for making a non-volatile memory device according to an embodiment of the present invention. As shown, the method uses a combination of steps including a fabricating nanocrystalline silicon hillock floating gate on a high K tunneling dielectric. Of course, there can be other variations, modifications, and alternatives. Other alternatives can also be provided where steps are added, one or more steps are removed, or one or more steps are provided in a different sequence without departing from the scope of the claims herein.

Referring to FIG. 1200, non-volatile memory device 1200 according to an embodiment of the invention includes nanocrystalline silicon hillock (Si—NCH) floating gates 1201 and 1202 on high K tunnel dielectric layer 141. A second dielectric layer 610 is formed over nano-crystalline floating gates 1201 and 1202. Control gate 710 is formed over the second dielectric layer. Contact structures 1211 and 1212 are coupled to source and drain regions 1220 and 1230, respectively.

When a predetermined voltage is applied to the control gate 710 and a second predetermined voltage is applied to the drain 1230, hot electrons are generated and injected to the floating gates. Non-volatile memory device 1200 provides high programming efficiency because of the low barrier height provided by the high K tunnel dielectric and the nanocrystalline silicon hillock (Si—NCH) floating gates. In some embodiments, thicker high K dielectrics are used in device 1200, and improved data retention can be obtained. In certain embodiments, the pointed top portions of the nanocrystalline silicon hillock (Si—NCH) floating gates lower the erase voltages and make charge pump design easier. Therefore improved device performance can be achieved with nonvolatile memory device 1200 according to embodiments of the present invention.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for making a non-volatile memory device, the method comprising:
   providing a semiconductor substrate including a surface region;
   forming a tunnel dielectric layer overlying the surface region;
   forming a source region within a first portion of the semiconductor substrate;
   forming a drain region within a second portion of the semiconductor substrate;
   depositing a first nanocrystalline silicon structure overlying a first portion between the source region and the drain region to form a first floating gate structure;
   depositing a second nanocrystalline silicon structure overlying a second portion between the source region and the drain region to form a second floating gate structure, while maintaining separation from the first nanocrystalline silicon structure;
   sputtering the deposited first and second nanocrystalline silicon structures to form a pointed top portion and a broad bottom portion;
   forming a second dielectric layer overlying the first floating gate structure and the second floating gate structure; and
   forming a control gate structure overlying the first floating gate structure and the second floating gate structure.

2. The method of claim 1, wherein the forming of the first nanocrystalline silicon structure and the forming of the second nanocrystalline silicon structure include using a high density plasma species.

3. The method of claim 1, wherein the depositing of the first nanocrystalline silicon structure and the depositing of the second nanocrystalline silicon structure comprises:
   heating the semiconductor substrate to above 500° C. in an argon ambient with an argon flow of about 50-500 sccm; wherein the first and second nanocrystalline silicon structures are deposited under a pressure of less than 1.0 torr, argon flow of about 50-500 sccm, and SiH4 flow of about 10-200 sccm; and the deposited first and second nanocrystalline silicon structures are sputtered in an argon ambient, with an argon flow of about 50-500 sccm and an RF bias power of about 500-3000 Watts.

4. The method of claim 3, further comprising repeating the heating, depositing, and sputtering steps at least one time.

5. The method of claim 1, wherein forming a tunnel dielectric layer comprises:

depositing HfO2 layer to a thickness of about 1-20 nm by LPCVD using Hafnium t-butoxide (Hf(OC4H9)4) precursor at about 300-500° C. with a pressure of about 1.0 torr; and annealing the HfO2 layer at about 600-800° C. in an gas ambient comprising NH3 or N2.

6. The method of claim 1, wherein the second dielectric layer is selected from the group consisting of HfO2, Al2O3, SiON, and SiN.

7. The method of claim 1, wherein the second dielectric layer is characterized by a dielectric constant higher than 3.9.

8. The method of claim 1, wherein the first floating gate structure is less than about 20 nanometers.

9. The method of claim 1 wherein the second floating gate structure is less than about 20 nanometers.

10. The method of claim 1 wherein the first floating gate structure is characterized by a triangular shape.

11. The method of claim 1 wherein the second floating gate structure is characterized by a triangular shape.

* * * * *